(12) United States Patent
Kominami et al.

(10) Patent No.: US 9,926,460 B2
(45) Date of Patent: Mar. 27, 2018

(54) COATING RESIN COMPOSITION

(71) Applicant: Teikoku Printing Inks Mfg. Co., Ltd., Tokyo (JP)

(72) Inventors: Yoshihumi Kominami, Tokyo (JP); Kenji Kinoshita, Japan (JP); Takuya Torihata, Tokyo (JP)

(73) Assignee: Teikoku Printing Inks Mfg. Co., Ltd., Tokyo (JP)

( * ) Notice: Subject to any disclaimer, the term of this patent is extended or adjusted under 35 U.S.C. 154(b) by 0 days.

(21) Appl. No.: 15/028,856

(22) PCT Filed: Sep. 29, 2015

(86) PCT No.: PCT/JP2015/077563
§ 371 (c)(1),
(2) Date: Apr. 12, 2016

(87) PCT Pub. No.: WO2017/056196
PCT Pub. Date: Apr. 6, 2017

(65) Prior Publication Data
US 2017/0247564 A1 Aug. 31, 2017

(51) Int. Cl.
| | |
|---|---|
| *C09D 133/10* | (2006.01) |
| *C09D 4/06* | (2006.01) |
| *C09D 175/16* | (2006.01) |
| *C08G 18/73* | (2006.01) |
| *B05D 3/06* | (2006.01) |
| *H05K 3/12* | (2006.01) |
| *H05K 3/28* | (2006.01) |
| *C08G 18/72* | (2006.01) |
| *C08G 18/75* | (2006.01) |
| *C09D 133/06* | (2006.01) |
| *C08F 290/04* | (2006.01) |

(52) U.S. Cl.
CPC ........... *C09D 133/10* (2013.01); *B05D 3/067* (2013.01); *C08F 290/04* (2013.01); *C08G 18/722* (2013.01); *C08G 18/73* (2013.01); *C08G 18/755* (2013.01); *C09D 4/06* (2013.01); *C09D 7/20* (2018.01); *C09D 133/066* (2013.01); *C09D 175/16* (2013.01); *H05K 3/1283* (2013.01); *H05K 3/282* (2013.01); *H05K 3/287* (2013.01)

(58) Field of Classification Search
None
See application file for complete search history.

(56) References Cited

U.S. PATENT DOCUMENTS

2014/0147776 A1* 5/2014 Ito ..................... G03F 7/038
430/18

FOREIGN PATENT DOCUMENTS

| JP | 2003071943 A | 3/2003 |
|---|---|---|
| JP | 2005068384 A | 3/2005 |
| JP | 2006328364 A | 12/2006 |
| JP | 2012136614 A | 7/2012 |
| JP | 2014051654 A | 3/2014 |
| JP | 2014173072 A | 9/2014 |
| WO | 2012160891 A1 | 11/2012 |
| WO | 2015/045200 A1 | 4/2015 |

OTHER PUBLICATIONS

New Edition Polymer Dictionary, Sep. 1, 1997, 5th printed edition, p. 269.

* cited by examiner

*Primary Examiner* — Sheeba Ahmed
(74) *Attorney, Agent, or Firm* — Richard M. Goldberg

(57) ABSTRACT

An ultraviolet curing type coating resin composition having all of respective beneficial features of excellent state in chemical resistance, under high temperature, against human skin protection creams containing a mixture of alkyl esters of benzoic acid, trademark), excellent state in gas barrier property against metal-corrosive gases as represented by sulfur-containing gases, and excellent state in flexibility that accommodates three-dimensional shape forming processing is demanded, includes an ultraviolet curing type coating resin composition containing an unsaturated-group-containing acrylic resin, with a weight average molecular weight of 5000 to 70000, a number of (meth)acrylate functional groups per molecule of 12 to 40, a hydroxyl value of 2 to 200 mgKOH/g, and with a glass transition temperature of 20 to 90° C., a volatile organic solvent, and a photopolymerization initiator.

12 Claims, No Drawings

COATING RESIN COMPOSITION

TECHNICAL FIELD

The invention relates to an ultraviolet curing type coating resin composition, which, upon being coated onto a base material surface, forms a coating film having satisfactory chemical resistance, gas barrier property, and flexibility that accommodates forming, and relates to an article coated with the coating resin composition.

BACKGROUND ART

Frequently with panels for household electric appliances, indicator panels for dashboard meters and automotive interior parts, etc., displays and housings for electric and electronic equipment, as well as electric and electronic interior parts having metal-based conductive circuits, etc., an overcoat is applied by means of a coating resin composition for long-term protection of the base materials and members, base decorative layers, conductive circuits, etc.

Recently with such a coating resin composition, in addition to the purpose of long-term protection of the coated object, chemical resistance against cosmetics, etc., gas barrier function against gases, such as corrosive gases, etc., and flexibility to follow forming processing to a three-dimensional shape are also becoming required anew.

It is inferred that the factors for these requirements are that human skin protection creams containing an aromatic compound mixture of alkyl esters of benzoic acid, as represented by the sunscreen Neutrogena Cream (registered trademark; the same applies hereinafter), are becoming widely used and chances of such protection creams becoming attached to various products and parts are increasing, that, in accompaniment with the downsizing of electric and electronic parts, etc., incorporated materials with conductive circuits are also being downsized and consequently, the conductive circuits themselves are also becoming miniaturized and are thus put in states of being corroded easily, for example, by gases containing sulfur that are high in metal corrosivity, and that flexible products and members and articles having diverse three-dimensional shapes are increasing.

Given these circumstances, preparing and using according to purpose coating resin compositions that respectively meet the each purpose in regard to the chemical resistance, the gas barrier property, and the flexibility that accommodates three-dimensional shape forming described above are not only extremely inefficient of course but also give rise to problems such that, for example, with a coating resin composition, having satisfactory gas barrier property but not having flexibility that accommodates three-dimensional shape forming, an article of desired shape cannot be obtained.

Therefore it is demanded to generate a coating resin composition having all of chemical resistance against human skin protection creams containing an aromatic compound mixture of alkyl esters of benzoic acid, as represented by Neutrogena Cream, gas barrier property against sulfur-containing gases, etc., and flexibility that accommodates three-dimensional shape forming (vacuum molding, pressure forming, vacuum/pressure forming, embossing, etc.) at the same time.

Especially in regard to the chemical resistance against human skin protection creams containing an aromatic compound mixture of alkyl esters of benzoic acid, as represented by Neutrogena Cream, automotive interior parts and electric and electronic parts, etc. may in some cases be put in a high temperature state of approximately 80° C. during use or when left to stand and therefore, having a chemical resistance for several hours or so under a high temperature environment is demanded.

Here, although activating energy ray curing type resin compositions, which are presumed to be high in hardness and excellent in chemical resistance and solvent resistance, are disclosed in Prior Patent Document 1 (Japanese Unexamined Patent Application Publication No. 2006-328364) and Prior Patent Document 2 (Japanese Unexamined Patent Application Publication No. 2014-051654), the performance is not sufficient in terms of gas barrier property and extensibility for accommodating forming.

Also, although arts related to irradiation curing type resin compositions that are excellent in gas barrier property are disclosed in Prior Patent Document 3 (Japanese Unexamined Patent Application Publication No. 2012-136614) and Prior Patent Document 4 (Japanese Unexamined Patent Application Publication No. 2003-071943), the performance is insufficient in terms of chemical resistance under a high temperature environment of approximately 80° C. and extensibility for accommodating forming.

PRIOR ART DOCUMENTS

Patent Documents

[Patent Document 1] Japanese Unexamined Patent Application Publication No. 2006-328364
[Patent Document 2] Japanese Unexamined Patent Application Publication No. 2014-051654
[Patent Document 3] Japanese Unexamined Patent Application Publication No. 2012-136614
[Patent Document 4] Japanese Unexamined Patent Application Publication No. 2003-071943

SUMMARY OF THE INVENTION

Problems to be Solved by the Invention

The invention has been created with the consideration for the problems described above and an object of the invention is to provide a coating resin composition having all of respective features of excellent state in chemical resistance against human skin protection creams containing an aromatic compound mixture of alkyl esters of benzoic acid, as represented by Neutrogena Cream, even under high temperature, excellent state in gas barrier property against metal-corrosive gases as represented by sulfur-containing gases, and excellent state in flexibility that accommodates three-dimensional shape forming processing.

Means for Solving the Problems

The invention relates to an ultraviolet curing type coating resin composition, comprising an ultraviolet curing type coating resin composition containing an unsaturated-group-containing acrylic resin, with a weight average molecular weight of 5000 to 70000, a number of (meth)acrylate functional groups per molecule of 12 to 40, a hydroxyl value of 2 to 200 mgKOH/g, and with a glass transition temperature of 20 to 90° C., a volatile organic solvent, and a photopolymerization initiator wherein the ultraviolet curing type coating resin composition has a chemically stable character, wherein the ultraviolet curing type coating resin composition has a gas barrier property, wherein the ultraviolet curing type coating resin composition has flexibility accommodating a three-dimensional shape forming processing.

Effect of the Invention

By the ultraviolet curing type coating resin composition according to the invention, it may be possible to provide a coating resin composition having all of the respective features of excellent state in chemical resistance against human skin protection creams containing an aromatic compound mixture of alkyl esters of benzoic acid, as represented by Neutrogena Cream, even under high temperature, excellent state in gas barrier property against metal-corrosive gases as represented by sulfur-containing gases, and excellent state in flexibility that accommodates three-dimensional shape forming processing, and to provide an article coated with the coating composition.

BEST MODE FOR CARRYING OUT THE INVENTION

As described above, the invention relates to an ultraviolet curing type coating resin composition, comprising (1) an ultraviolet curing type coating resin composition containing an unsaturated-group-containing acrylic resin, with a weight average molecular weight of 5000 to 70000, a number of (meth)acrylate functional groups per molecule of 12 to 40, a hydroxyl value of 2 to 200 mgKOH/g, and with a glass transition temperature of 20 to 90° C., a volatile organic solvent, and a photopolymerization initiator wherein the ultraviolet curing type coating resin composition has a chemically stable character, wherein the ultraviolet curing type coating resin composition has a gas barrier property, and wherein the ultraviolet curing type coating resin composition has flexibility accommodating a three-dimensional shape forming processing.

Further, the invention relates to the ultraviolet curing type coating resin composition according to (1) wherein (2) the ultraviolet curing type coating resin composition further contains 2.5 to 10 parts by weight of a polyisocyanate with an NCOwt % of 6 to 24 compared with 100 parts by weight of the acrylic resin.

Further, the invention relates to the ultraviolet curing type coating resin composition according to (1) wherein (3) the volatile organic solvent of the ultraviolet curing type coating resin composition is any one or combination of a glycol-based solvent, an ester-based solvent, a ketone-based solvent, a polyhydric alcohol-based solvent, and an aromatic hydrocarbon-based solvent.

Further, the invention relates to the ultraviolet curing type coating resin composition according to (1) wherein (4) the ultraviolet curing type coating resin composition further contains more than 0 parts and not more than 80 parts by weight of a photopolymerizable low-molecular-weight compound that undergoes crosslinking or a polymerization reaction by ultraviolet rays compared with 100 parts weight of the acrylic resin.

Further, the invention relates to the ultraviolet curing type coating resin composition according to (4) wherein (5) the photopolymerizable low-molecular-weight compound is one or two or more selected from among acryloylmorpholine, vinyl caprolactam, ethyl carbitol (meth)acrylate, phenoxyethyl (meth)acrylate, isobornyl (meth)acrylate, and 2-hydroxyethyl vinyl ether.

Further, the invention relates to the ultraviolet curing type coating resin composition according to (1) wherein (6) the ultraviolet curing type coating resin composition contains more than 0 parts and not more than 10 parts by weight of an acrylic-based high-molecular-weight polymer additive and/or a silicon-based additive for fitting to screen printing compared with 100 parts by weight of the acrylic resin.

Further, the invention relates to (7) a coated article having a hardened coating layer of the ultraviolet curing type coating resin composition according to (1).

Further, the invention relates to (8) a coated article with a three-dimensional shape, having a hardened coating layer of the ultraviolet curing type coating resin composition according to (1).

Further, the invention relates to the ultraviolet curing type coating resin composition according to (2) wherein (9) the polyisocyanate is any one or combination of hexamethylene diisocyanate and isophorone diisocyanate.

Further, the invention relates to the ultraviolet curing type coating resin composition according to (1) wherein (10) the manufacturing method is performed with an order of a coating step, a heating and drying step, and an ultraviolet irradiation step.

Further, the invention relates to the ultraviolet curing type coating resin composition according to (10), wherein (11) the manufacturing method is performed with an order of a coating step, a heating and drying step, a three-dimensional shape forming step, and an ultraviolet irradiation step.

Terms used in the present specification shall be expressed as follows hereinafter.

"NC resistance" shall indicate chemical resistance against human skin protection creams containing an aromatic compound mixture of alkyl esters of benzoic acid, as represented by Neutrogena Cream.

"NC" shall indicate Neutrogena Cream.

"S gas barrier property" shall indicate gas barrier property against metal-corrosive gases as represented by sulfur-containing gases.

"F formability" shall indicate flexibility that accommodates three-dimensional shape forming processing.

The acrylic resin used in the invention has a weight average molecular weight of 5000 to 70000, preferably 6000 to 50000, and more preferably 9000 to 30000.

If the weight average molecular weight of the acrylic resin is less than 5000, the molecular structure is small and therefore the aromatic compound mixture of alkyl esters, etc., of benzoic acid, contained in the "NC," permeates more easily and especially the "NC resistance" under a high temperature environment of approximately 80° C. will be poor.

On the other hand, if the weight average molecular weight exceeds 70000, the solubility in the volatile organic solvent decreases and therefore the mixing ratio of the acrylic resin must be made small to secure a viscosity suitable for coating. A coating film formed by coating and dry-curing such a coating resin composition will be small in film thickness, thus making the "S gas barrier property" poor in particular.

Further, with the acrylic resin used in the invention, the average number of (meth)acrylate functional groups per molecule is 12 to 40, preferably 12 to 34, and more preferably 20 to 30. Here, the average number of (meth)acrylate functional groups per molecule refers to the number of (meth)acrylate functional groups present per molecular weight of a single molecule as calculated from the GPC number average molecular weight.

If the average number of (meth)acrylate functional groups is less than 5, a sufficient crosslinked structure cannot be realized by ultraviolet irradiation and the "NC resistance" and the "S gas barrier property" will be poor.

On the other hand, if the average number of (meth) acrylate functional groups exceeds 40, the crosslink density due to ultraviolet irradiation will be too high and the "F formability" will be poor.

Further, the acrylic resin used in the invention has hydroxyl groups and a hydroxyl value of 2 to 200 mgKOH/g, preferably 50 to 150 mgKOH/g, and more preferably 90 to 130 mgKOH/g.

If the hydroxyl value is less than 2 mgKOH/g, the "NC resistance" and the "S gas barrier property" tend to be poor. Although the reason for this is not clearly understood, according to consideration by the present inventors, the hydroxyl groups provide an action of increasing the reactivity of the (meth)acrylate functional groups to ultraviolet rays and the above is considered to be because as the hydroxyl value decreases, the polar portion based on the hydroxyl groups in the acrylic resin decreases, the reactivity to ultraviolet rays of the (meth)acrylate functional groups in the acrylic resin decreases, and forming of a tough final coating film tends to become difficult.

On the other hand, if the hydroxyl value exceeds 200 mgKOH/g, many residual hydroxyl groups will be present, causing increase of affinity with the aromatic compound mixture of alkyl esters of benzoic acid contained in the "NC" and degrading the "NC resistance."

Further, with the acrylic resin used in the invention, the glass transition temperature is 20 to 90° C., preferably 40 to 80° C., and more preferably 50 to 70° C.

If the glass transition temperature is less than 20° C., tack (extent of sticky state) will remain in the coated coating film after the heating and drying process and degrade workability until transition to the next step, and the coating film that is ultimately cured by ultraviolet irradiation will be poor in the "NC resistance" under the high temperature environment in particular.

On the other hand, if the glass transition temperature exceeds 90° C., the coating film that is ultimately cured by ultraviolet irradiation will be too high in glass transition temperature and cause hindrance in performing "F forming" efficiently.

The acrylic resin used in the invention and having all of can be provided as suited from a manufacturer having excellent resin synthesis technology, such as Toagosei Co., Ltd., Nippon Shokubai Co., Ltd., DIC Corporation, Mitsui Chemicals, Inc., Nippon Kayaku Co., Ltd., Mitsubishi Rayon Co., Ltd., etc.

The volatile organic solvent used in the invention is not restricted in particular as long as it has compatibility with the acrylic resin used in the invention, and a solvent that is preferred as having satisfactory compatibility and dissolubility is any one or combination of a glycol-based solvent, an ester-based solvent, a ketone-based solvent, a polyhydric alcohol-based solvent, and an aromatic hydrocarbon-based solvent.

Also, although there is no particular restriction in the boiling point of the volatile organic solvent, if the ultraviolet curing type coating resin composition according to the invention is to be coated by screen printing, it is preferred for a solvent with a boiling point of not less than 170° C. to be contained at an amount of not less than 30 wt % compared with the total amount of the volatile organic solvent contained in the ultraviolet curing type coating resin composition according to the invention to suppress drying on a screen plate and perform stable mass production.

Isophorone, dibasic acid esters (DBE), 3-methoxy-3-methylbutanol, 3-methoxy-3-methylbutyl acetate, ethylene glycol monobutyl ether acetate, coal tar naphtha with a boiling point exceeding 170° C., diethylene glycol monoethyl ether (acetate), diethylene glycol monobutyl ether (acetate), triethylene glycol monobutyl ether (acetate), γ-butyrolactone, etc., and preferred examples of a volatile solvent with a boiling point of less than 170° C. include ethyl acetate, butyl acetate, propyl acetate, cyclohexanone, xylene, mineral spirits with a boiling point of 150 to 170° C., coal tar naphtha with a boiling point of 160 to 170° C., propylene glycol monomethyl ether (acetate), isopropyl alcohol, diacetone alcohol, etc. may be listed up as preferred examples of a volatile solvent with a boiling point of not less than 170° C.

Although the mixing amount of the volatile organic solvent used in the invention is not always restricted, if the solvent mixing ratio becomes too high, the final coating film thickness after undergoing the heating and drying and ultraviolet irradiation steps will be small and especially the "S gas barrier property" will be poor. Although several times of recoating may be performed to compensate for this, efficiency will be lacking.

Therefore, in order to obtain sufficient "NC resistance," "S gas barrier property," and "F formability" in a single coating, it is desirous in the mixing ratio of the volatile organic solvent to set not more than 1000 parts by weight compared with 100 parts by weight of the acrylic resin used in the invention. Also, a coating film thickness that is favorable as the final coating thickness after undergoing the heating and drying and ultraviolet irradiation steps is not less than 8 μm, more preferably not less than 10 μm, and even more preferably not less than 15 μm.

On the other hand, if the mixing amount of the volatile organic solvent is too low, the viscosity of the coating resin composition will be high and suitability for various types of coating, such as roller coating, spin coating, spray coating, gravure coating, screen printing coating, etc., will be poor. It is therefore desirous in the mixing ratio of the volatile organic solvent to set not less than 100 parts by weight compared with 100 parts by weight of the acrylic resin used in the invention.

The ultraviolet curing type coating resin composition according to the invention may contain a polyisocyanate for the purpose of improving close adhesion to various base materials and to further improve the "NC resistance," "S gas barrier property," and "F formability," and the favorable polyisocyanate has an NCOwt % of 6 to 24 wt %, preferably 6.5 to 20 wt %, and more preferably 7 to 15 wt %.

If the NCOwt % is less than 6 wt %, the reaction rate will be slow and the crosslink density will be low, and therefore effects of improving any of close adhesion, "NC resistance," "S gas barrier property," and "F formability" cannot be expected.

On the other hand, if the NCOwt % exceeds 24 wt %, the crosslink density will be too high and there will be a tendency for problems to arise in securing the "F formability" with stability.

Also with the invention, it is desirous to set the polyisocyanate contained at 2.5 to 10 parts by weight, preferably 3 to 8 parts by weight, and more preferably 4 to 7 parts by weight compared with 100 parts by weight of the acrylic resin.

If the polyisocyanate is less than 2.5 parts by weight, the crosslink density will be low, and therefore effects of improving any of close adhesion, "NC resistance," "S gas barrier property," and "F formability" cannot be expected.

On the other hand, if the polyisocyanate exceeds 10 parts by weight, a large amount of unreacted isocyanate will remain and have adverse effects on close adhesion, "NC resistance," "S gas barrier property," and "F formability."

Although any of various polyisocyanates may be used in the invention as long as the NCOwt % is 6 to 24 wt %, in consideration of yellowing property and weather resistance of the coating film, it is desired to use a polyisocyanate constituted of any one or combination of hexamethylene diisocyanate and isophorone diisocyanate.

A block type polyisocyanate designed so as not to cause reaction up to a fixed temperature may also be used.

As such a polyisocyanate, selection and use as suited may be made from products sold by DIC Corporation, Mitsui Chemicals, Inc., Tosoh Corporation, Asahi Kasei Chemicals Corporation, etc.

In order to reduce the usage amount of the volatile organic solvent, the ultraviolet curing type coating resin composition according to the invention may contain a photopolymerizable low-molecular-weight compound that undergoes crosslinking or a polymerization reaction by ultraviolet rays at not more than 80 parts by weight, preferably 70 parts by weight, and more preferably not more than 50 parts by weight compared with 100 parts by weight of the acrylic resin.

If the content of the photopolymerizable low-molecular-weight compound exceeds 80 parts by weight, the rate of curing by ultraviolet rays will be slow and the amount present of the photopolymerizable low-molecular-weight compound, which is low in molecular weight, will be high and consequently, the toughness of the cured coating film as a whole will tend to decrease and the "NC resistance" and the "S gas property" will tend to be poor.

Photopolymerizable monomers, such as acryloylmorpholine, vinyl caprolactam, ethyl carbitol (meth)acrylate, phenoxyethyl (meth)acrylate, isobornyl (meth)acrylate, butanediol mono(meth)acrylate, 2-hydroxyethyl (meth)acrylate, N,N-diethylaminoethyl (meth)acrylate, N,N-dimethylaminoethyl (meth)acrylate, polyethylene glycol mono(meth)acrylate, polypropylene glycol mono(meth)acrylate, polyethylene glycol di(meth)acrylate, tripropylene glycol di(meth)acrylate, 1,6-hexanediol di(meth)acrylate, 1,9-nonanediol di(meth)acrylate, neopentyl glycol di(meth)acrylate, trimethylolpropane tri(meth)acrylate, pentaerythritol tri(meth)acrylate, pentaerythritol tetra(meth)acrylate, dipentaerythritol penta(meth)acrylate, dipentaerythritol hexa(meth)acrylate, N,N-dimethylacrylamide, 2-hydroxyethyl vinyl ether, etc., and generally commercially available prepolymers, such as urethane acrylates, polyester acrylates, epoxy acrylates, etc., that are not more than trifunctional may be listed up as examples of such a photopolymerizable low-molecular-weight compound, and one or a mixture of two or more of these compounds may be used.

The photopolymerizable low-molecular-weight compound that is easily used is one with a low number of functional groups and a weight average molecular weight of not more than approximately 10000, preferably not more than 6000, and more preferably not more than 3000.

This is because in general, with increase of the number of functional groups and/or average molecular weight of the photopolymerizable low-molecular-weight compound, the viscosity increases and makes it difficult to adjust the ultraviolet curing type coating resin composition according to the invention to a viscosity appropriate for coating.

Acryloylmorpholine, vinyl caprolactam, ethyl carbitol (meth)acrylate, phenoxyethyl (meth)acrylate, isobornyl (meth)acrylate, and 2-hydroxyethyl vinyl ether may be listed up as examples of the photopolymerizable low-molecular-weight compound with a low number of functional groups and a weight average molecular weight of not more than approximately 3000, and these compounds also have the merit of excellent adhesion to plastic base materials in particular.

Further, in order to achieve satisfactory curing by ultraviolet irradiation, the ultraviolet curing type coating resin composition according to the invention contains a photopolymerization initiator at 5 to 20 parts by weight, preferably 7 to 18 parts by weight, and more preferably 10 to 15 parts by weight compared with 100 parts by weight of the acrylic resin.

If the content of the photopolymerization initiator is less than 5 parts by weight, sufficient ultraviolet curing will not be performed and the "NC resistance" and the "S gas barrier property" will be weak.

On the other hand, if the content of the photopolymerization initiator exceeds 20 parts by weight, a large amount of unreacted photopolymerization initiator will remain and cause adverse effects in regard to the "F formability," such as clouding of the coating film during the forming, etc.

Benzoin ethyl ether, 2-hydroxy-2-methyl-1-phenylpropane-1-one, α-hydroxyacetophenone, 1-hydroxycyclohexyl phenyl ketone, 2-methyl-1-(4-(methylthio)phenyl)-2-morpholinopropanone-1, bisacylphosphine oxide, thioxanthone, sulfone oxide, etc. may be listed up as examples of the photopolymerization initiator, and if yellowing of the cured coating film is to be avoided, using α-hydroxyacetophenone, 1-hydroxycyclohexyl phenyl ketone, or bisacylphosphine oxide is favorable.

In the invention not only a photopolymerization initiator, but also a thermopolymerization initiator may be used, and acyl peroxides, such as benzoyl peroxide and other hydroperoxides such as cumene hydroperoxide, and azo compounds, such as azobisisobutyronitrile may be used as examples of a thermopolymerization initiator.

Also, a coloring agent, extender pigment, etc., may be mixed in the ultraviolet curing type coating resin composition according to the invention to a degree such that the "NC resistance," "S gas barrier property," and "F formability" are not compromised. The influence of minute voids that form in the coating film due to mixing of the coloring agent or extender pigment must be taken into consideration, and a mixing amount of the coloring agent or extender pigment, etc., with which the "NC resistance," "S gas barrier property," and "F formability" will not be compromised for practical purposes, is not more than 70 parts by weight, preferably not more than 60 parts by weight, and more preferably not more than 50 parts by weight compared with 100 parts by weight of the acrylic resin.

Azo pigments, disazo pigments, bisazo pigments, phthalocyanine pigments, anthraquinone-based pigments, isoindolinone pigments, dioxazine pigments, quinacridone pigments, perylene-based pigments, carbon black pigments, lake black pigments, perylene black pigments, aniline black pigments, iron oxide pigments, titanium pigments, zinc sulfide pigments, various chromatic color dyes, etc. may be listed up as examples of the coloring agent, and one or a combination of a plurality of the coloring agents may be used.

Silica (fine particulate), talc, calcium carbonate, magnesium carbonate, bentonite, sedimentary barium sulfate, zinc oxide, alumina, various other fillers, etc. may be listed up as examples of the extender pigment.

Also, resin beads, metallic particles, metal powder, metal oxide powder, graphite, pearl pigment, fluorescent pigments, wax particles, protein powder, etc. Also included are functional materials, such as ultraviolet absorbing materials, antimicrobial materials, heat absorbing materials, refractive index-modifying materials, slidability-imparting materials, slidability-preventing materials, phosphorescencent materials, polarizing materials, anti-reflection materials, diffusible materials, etc. may be listed up as examples of the other fillers, and one or a combination of a plurality of the fillers may be used.

By making an acrylic-based high-molecular-weight polymer additive and/or a silicon-based additive for fitting to screen printing to the ultraviolet curing type coating resin composition according to the invention be contained at not more than 10 parts by weight compared with 100 parts by weight of the acrylic resin, high thickness film coating which is one of the excellent characteristics of screen printing, can be performed easily.

The amount of the additive added to the ultraviolet curing type coating resin composition according to the invention may be an amount at which a screen printing coated coating film can be obtained with good leveling and without foaming or cissing, and generally, if the amount is less than 0.1 parts by weight compared with 100 parts by weight of the acrylic resin, it is difficult to obtain a leveling effect and foaming and cissing prevention effects sufficiently in many cases, and if an amount exceeding 10 parts by weight is contained, ill effects in regard to the "F formability," such as clouding, etc., of the coating film during the forming, occur easily. Therefore, the mixing amount of the additive is preferably 0.1 to 8 parts by weight and more preferably 0.1 to 6 parts by weight compared with 100 parts by weight of the acrylic resin.

Additive products sold by ALTANA, Shin-Etsu Chemical Co., Ltd., Kusumoto Chemicals, Ltd., etc. may be selected and used as such an additive.

The screen-printable ultraviolet curing type coating resin composition according to the invention is a coating that can easily be made high in film thickness as described above and is therefore especially advantageous in terms of the "S gas barrier property" for protection against corrosion of metals from gases that corrode metals.

For example, in the case where the ultraviolet curing type coating resin composition according to the invention is coated onto a member on which a circuit is printed using a metal-based conductive paste, such as a silver paste or copper paste, etc., the coating acts amazingly and extremely advantageously in regard to the "S gas barrier property" by enabling, for example, sufficient suppression of discoloration due to corrosion of the conductive circuit after putting the coated article for 24 hours in an atmosphere saturated with a gas generated by placing sulfur powder in an 80° C. environment, the "NC resistance" is also satisfactory.

In the case where the base material of the coated article is, for example, a PET base material, a flexible conductive circuit article having a three-dimensional shape can also be obtained easily because the coating also has the "F formability."

The ultraviolet curing type coating resin composition according to the invention can be utilized comprehensively and extremely advantageously on electric and electronic parts and member-related areas such as described in [0045], can also be utilized advantageously on meters, control panels, and other articles that are interior parts of automobiles and other vehicles, for which there are frequent chances of contact by persons and attachment of "NC," and, especially in cases where a conductive circuit member is installed on the article or a window exterior article is one that is formed to a three-dimensional shape, can be used comprehensively and amazingly and extremely advantageously in regard to the "S gas barrier property" and the "F formability" as well.

With the ultraviolet curing type coating resin composition according to the invention, a coated article coated by the ultraviolet curing type coating resin composition and having both the "NC resistance" and "S gas barrier property," can be prepared and provided by performing a coating step, a heating or drying step, and an ultraviolet irradiation step as is described order.

As a coating base material used in the coated article provided by the invention, any of various plate-like base materials, sheet-like base materials, film-like base materials, etc., that is a painted slab or made of polyester (PET), polycarbonate (PC), acryl, polypropylene (PP), polyethylene (PE), vinyl chloride, etc., may be listed up, and a layer of decoration, etc., or a conductive circuit layer, etc., may be furnished on the base material.

As a coating method in the coating step, any of roller coating, spin coating, spray coating, gravure coating, coating by spatula or brush, screen printing coating, etc., may be used, screen printing coating may be favorably used for obtaining easily a uniform, thick-film coating layer.

In the heating and drying step, as standard conditions, heating and drying are performed at 80° C. for approximately 30 minutes to disperse the volatile organic solvent in the coated coating film of the ultraviolet curing type coating resin composition according to the invention and the hydroxyl groups in the acrylic resin and the polyisocyanate of the invention are made to react favorably. At the time of heating and drying step, the coated coating film changes to a tack-free state and changes to a coated film state that does not hinder for a subsequent step, such as forming. Bending and forming can thus be performed at the time.

In the ultraviolet irradiation, a step of hardening ultimately the coated coating film that has undergone the heating and drying step may be adopted with metal halide lamp ultraviolet irradiation of an integrated light amount of approximately 400 $mJ/cm^2$ and a peak illuminance of approximately 400 $mW/cm^2$ as a standard example, and in this step, the functional groups that react to ultraviolet rays undergo crosslink reactions to ultimately form the coating film that has excellent toughness and therefore has excellent "NC resistance" and "S gas barrier property."

According to the ultraviolet curing type coating resin composition of the invention, a three-dimensionally shaped coated article is produced by performing a coating step, a heating or drying step, a three-dimensional shape forming step, and an ultraviolet irradiation step as is described order.

And the three-dimensionally shaped coated article with both of the "NC resistance" and "S gas barrier property," may be provided and offered easily.

The coating article having the three-dimensional shape can be provided and offered easily by performing the heating and drying step of [0052] above and thereafter performing the three-dimensional shape forming step before the ultraviolet irradiation step of [0053] above.

In the three-dimensional shape forming step, the coated article is produced with deformation after the heating and drying step, using a mold with a desired three-dimensional shape and by means of a vacuum forming machine, a pressure forming machine, a vacuum/pressure forming machine, an embossing machine, etc.

In the case of the ultraviolet curing type coating resin composition according to the invention, an elongation percentage of 250 to 300% can be accommodated.

And by performing the ultraviolet irradiation step after performing the three-dimensional shape forming step, the three-dimensionally shaped coated article of a coated article forming processed to the desired three-dimensional shape with both the "NC resistance" and "S gas barrier property," can be provided and offered easily.

Examples

Examples of the invention and comparison are shown in [Table 1] below. However, the invention is not limited to the examples.

TABLE 1

| <<Mixture Materials>> (mixing amounts indicated in parts by weight) | | | Ex. 1 | Ex. 2 | Ex. 3 | Ex. 4 | Ex. 5 | Ex. 6 | Ex. 7 | Ex. 8 | Ex. 9 | Ex. 10 | Ex. 11 | Ex. 12 | Ex. 13 |
|---|---|---|---|---|---|---|---|---|---|---|---|---|---|---|---|
| Acrylic resin | Physical property values | Weight average molecular weight | 5000 | 6000 | 6000 | 9000 | 9000 | 9000 | 10000 | 20000 | 20000 | 30000 | 30000 | 40000 | 50000 |
| | | Number of (meth)acrylate functional groups | 5 | 12 | 30 | 20 | 25 | 20 | 25 | 25 | 34 | 30 | 10 | 10 | 34 |
| | | Hydroxyl value [mgKOH/g] | 2 | 50 | 130 | 90 | 100 | 2 | 150 | 110 | 50 | 120 | 130 | 10 | 150 |
| | | Glass transition temperature [° C.] | 20 | 40 | 70 | 50 | 55 | 90 | 40 | 60 | 80 | 70 | 40 | 50 | 80 |
| | | Mixing amount of acrylic resin [parts by weight] | 100 | 100 | 100 | 100 | 100 | 100 | 100 | 100 | 100 | 100 | 100 | 100 | 100 |
| Volatile Organic solvent | | Isophorone (boiling point: 216° C.) | | 500 | | 100 | | | | | | | | | |
| | | Diethylene glycol monobutyl ether (boiling point: 230° C.) | 100 | | 400 | | | | 250 | 100 | 60 | | 200 | | 400 |
| | | 3-methoxy-3-methylbultanol (boiling point: 174° C.) | | | | | | 200 | | 250 | 50 | 350 | | 150 | |
| | | Cyclohexanone (boiling point: 156° C.) | | | | | 150 | | | | | 50 | 50 | | |
| | | Propylene glycol monomethyl ether acetate (boiling point: 120° C.) | 50 | 100 | 400 | 100 | | 40 | 100 | | 40 | | 50 | 50 | 50 |
| | | Coal tar naphtha (Boiling point: less than 160-170° C.) | | 100 | 400 | | 150 | 10 | | | | | | | 50 |
| Polyisocyanate | | Hexamethylene diisocyanate (NCO = 24 wt %) | | | | | | | | | | | | | 2 |
| | | Hexamethylene diisocyanate (NCO = 7 wt %) | | | | 4 | | | | | | | | | |
| | | Hexamethylene diisocyanate (NCO = 6.5 wt %) | | | | | | | 7 | | | | | | |
| | | Isophorone diisocyanate (NCO = 20 wt %) | | | | | | | | | 8 | | | | |
| | | Isophorone diisocyanate (NCO = 15 wt %) | | | | | | | | | | | | 3 | |
| | | Block type Is (NCO = 6 wt %) | 10 | | | | | | | | | | | | |
| Photopolymerizable low-molecular-weight compound | | Acryloylmorpholine | 35 | | | | | | | | | | | | |
| | | Vinyl caprolactam | | 20 | | | | | | | | | | | |
| | | Ethyl carbitol acrylate | | | | | 20 | | | | 30 | | | | |
| | | Phenoxyethyl acrylate | | | | | | | | | 30 | | | | |
| | | Isobornyl acrylate | | | | | | | | | | | 30 | | |
| | | 2-hydroxyethyl vinyl ether | | | | | | | | | | | | 50 | |
| | | Pentaerythritol hexaacrylate | 35 | | | | | | | 80 | | | | | |
| | | Difunctional aliphatic urethane acrylate | | | | | 20 | | | | | | | | 30 |
| Photo/thermo-polymerization initiator | | α-hydroxyacetophenone | 10 | | 10 | | 7 | | | | | 20 | 5 | 15 | 7 |
| | | 1-hydroxycyclohexyl phenyl ketone | | 10 | | 18 | | 7 | 5 | | | 5 | | 7 | |
| | | bisacylphosphine oxide | | | 10 | | | 8 | | | 10 | | | 6 | 10 |
| Coloring agent, filler | | Black pigment (microlith black C-K) | | | | | | | | | | | | | 1 |
| | | Urethane resin beads | | | 50 | | | | | | | | | | |
| Additive | | Acrylic-based high-molecular-weight polymer additive | 1 | | | | | 6 | | 5 | | 1 | | | 10 |
| | | Silicon-based additive | | | | 8 | 2 | | 1 | | 6 | | 7 | 3 | |
| <<Evaluation>> | | | | | | | | | | | | | | | |
| "NC resistance" Resistance against Neutrogena cream | | | G | VG | G | VG | VG | VG | VG | VG | VG | VG | VG | G | G |

TABLE 1-continued

| | | | | | | | | | | | | |
|---|---|---|---|---|---|---|---|---|---|---|---|---|
| "S gas barrier property" Gas barrier property against sulfur combustion gas | | | G | G | G | VG | VG | G | VG | VG | VG | VG | VG | G | VG |
| "F formability" Three-dimensional shape formability | | | G | G | VG | G | VG | VG | G | VG | G | VG | VG | VG | G |
| "Screen printing coating suitability" Mass-production printing stability | | | VG | F | F | VG | F | G | VG | VG | G | VG | F | G | VG |

| <<Mixture Materials>> (mixing amounts indicated in parts by weight) | | | Ex. 14 | Ex. 15 | Comp Ex. 1 | Comp Ex. 2 | Comp Ex. 3 | Comp Ex. 4 | Comp Ex. 5 | Comp Ex. 6 | Comp Ex. 7 | Comp Ex. 8 |
|---|---|---|---|---|---|---|---|---|---|---|---|---|
| Acrylic resin | Physical property values | Weight average molecular weight | 70000 | 70000 | 3000 | 90000 | 7000 | 60000 | 10000 | 20000 | 50000 | 30000 |
| | | Number of (meth)acrylate functional groups | 40 | 30 | 6 | 40 | 3 | 50 | 20 | 30 | 35 | 10 |
| | | Hydroxyl value [mgKOH/g] | 200 | 50 | 10 | 150 | 100 | 80 | 0 | 300 | 130 | 50 |
| | | Glass transition temperature [° C.] | 90 | 40 | 40 | 70 | 50 | 60 | 30 | 80 | 10 | 100 |
| | | Mixing amount of acrylic resin [parts by weight] | 100 | 100 | 100 | 100 | 100 | 100 | 100 | 100 | 100 | 100 |
| Volatile Organic solvent | | Isophorone (boiling point: 216° C.) | | 600 | | | | | 100 | | 200 | 200 |
| | | Diethylene glycol monobutyl ether (boiling point: 230° C.) | 500 | | 200 | | | | 100 | | | |
| | | 3-methoxy-3-methylbultanol (boiling point: 174° C.) | | 600 | | 1500 | | 100 | | 200 | | |
| | | Cyclohexanone (boiling point: 156° C.) | | | | | | 100 | 50 | | | 25 |
| | | Propylene glycol monomethyl ether acetate (boiling point: 120° C.) | | 300 | 50 | 500 | 50 | 50 | | | 25 | 25 |
| | | Coal tar naphtha (Boiling point: less than 160-170° C.) | 200 | | | 200 | | | | 25 | 25 | 25 |
| Polyiso-cyanate | | Hexamethylene diisocyanate (NCO = 24 wt %) | | | | | | | | | | |
| | | Hexamethylene diisocyanate (NCO = 7 wt %) | | | | 10 | | | | | | |
| | | Hexamethylene diisocyanate (NCO = 6.5 wt %) | | | | | | | | | | |
| | | Isophorone diisocyanate (NCO = 20 wt %) | | | | | | | | | | |
| | | Isophorone diisocyanate (NCO = 15 wt %) | | | | | | 10 | | | | |
| | | Block type Is (NCO = 6 wt %) | | | | | | | | | 10 | |
| Photo-polymer-izable low-molecular-weight compound | | Acryloylmorpholine | | | | | | | | | | |
| | | Vinyl caprolactam | | | | | | | | | | |
| | | Ethyl carbitol acrylate | | | 30 | | | | | | | |
| | | Phenoxyethyl acrylate | | | 30 | | | | | | | |
| | | Isobornyl acrylate | | | | | | | | | | |
| | | 2-hydroxyethyl vinyl ether | | | | | | | | | | |
| | | Pentaerythritol hexaacrylate | | | | | | | 40 | | | |
| | | Difunctional aliphatic urethane acrylate | | | | | | | | 50 | | |
| Photo/thermo-polymer-ization initiator | | α-hydroxyacetophenone | | 5 | 10 | 16 | 12 | 8 | | | | |
| | | 1-hydroxycyclohexyl phenyl ketone | 7 | | | | | | 10 | 16 | 12 | 8 |
| | | bisacylphosphine oxide | | | | | | 8 | | | 12 | 8 |
| Coloring agent, filler | | Black pigment (microlith black C-K) | | | | | | | | | | |
| | | Urethane resin beads | | | | | | | | | | |
| Additive | | Acrylic-based high-molecular-weight polymer additive | | 0 | 5 | 5 | 5 | 5 | | | | |
| | | Silicon-based additive | | | | | | | 5 | 5 | 5 | 5 |
| <<Evaluation>> | | | | | | | | | | | | |
| "NC resistance" Resistance against Neutrogena cream | | | VG | G | G | F | G | VG | F | F | F | VG |

TABLE 1-continued

| "S gas barrier property" Gas barrier property against sulfur combustion gas | VG | G | F | F | VG | VG | F | VG | F | VG |
|---|---|---|---|---|---|---|---|---|---|---|
| "F formability" Three-dimensional shape formability | G | G | VG | VG | VG | F | G | VG | F | F |
| "Screen printing coating suitability" Mass-production printing stability | F | VG | G | VG | P | VG | VG | VG | VG | VG |

In table 1, VG, G, F, and P mean following state:
VG: Very Good
G: Good
F: Fair
P: Poor The ultraviolet curing type coating resin compositions of the Examples and Comparative Examples were prepared by measuring out the materials indicated in Table 1 into a preparation container at the mixing ratios (weight parts) indicated in the table and mixing the materials uniformly by stirring using a propeller rotating stirrer.

[Coating Step]

Subsequently, by performing 12×12 cm full solid screen printing using a T150 mesh/inch screen printing plate, each of the prepared ultraviolet curing type coating resin compositions was coated on a transparent PC of 0.5 mm thickness furnished with line-shaped conductive silver paste circuits at equal intervals.

[Heating and Drying Step]

The coated articles performed by the coating step were then heated and dried at 80° C. for 30 minutes in a box type dryer. Measurement of the coating film thicknesses of the coated coating films that have undergone this step showed the thicknesses to be 8 to 12 μm.

[Three-Dimensional Shape Forming Step]

The coated articles performed by the heating and drying step were then formed after mounting a ladybug-shaped mold, with a shape such that a maximum elongation of 250% will occur when the coated article was formed, onto a vacuum/pressure forming machine.

[Ultraviolet Irradiation Step]

The coated articles performed by the three-dimensional shape forming step were then irradiated with metal halide lamp ultraviolet irradiation at conditions of an integrated light amount of 400 mJ/cm$^2$ and a peak illuminance of 400 mW/cm$^2$, and the coating film was ultimately hardened.

Performance evaluations were performed on the ultraviolet curing type coating resin compositions according to the invention, articles with which the coating compositions were heated and dried, and three-dimensionally shaped articles coated with the coating compositions.

Evaluation of "NC Resistance"

With each of the coated articles of the invention that have the three-dimensional shape and were ultimately irradiated with ultraviolet rays, "NC" was uniformly coated by hand onto a portion at which the elongation percentage became 250% and after leaving for 5 hours under an 80° C. environment, the "NC" was rinsed off cleanly with tap water and whether or not any abnormalities occurred at the portion was checked visually.

Judgments were made as follows and VG and G were deemed as passing levels.

VG: Absolutely no abnormalities were observed by observation using a magnifying lens of 4 times magnification.

G: Slight clouding was observed by observation using a magnifying lens of 4 times magnification.

F: Clouding and change of gloss was observed visually.

P: Crazing, cracking, dissolution of coating film, or peeling of coating film, etc., was observed visually.

Evaluation of "S Gas Barrier Property"

With each of the coated articles of the invention that have the three-dimensional shape and were ultimately irradiated with ultraviolet rays, a sample chip of 5×5 cm square, including a portion at which the elongation percentage became 250%, was cut out.

Subsequently, an aluminum cup, with 0.5 g of sulfur powder placed therein, was then placed inside a sealable glass jar container, a stainless steel wire mesh was placed on the cup, and the sample chip was placed on the wire mesh, with the cured film of the ultraviolet curing type coating resin composition according to the invention facing upward.

Then, the glass jar container was then sealed and after storing for 24 hours at 80° C., the sample chip was taken out and whether or not any abnormalities, such as discoloration due to corrosion, etc., occurred in the conductive silver paste circuit was checked visually. Judgments were made as follows and VG and G were deemed as passing levels.

VG: Absolutely no abnormalities, such as discoloration, etc., were observed by observation using a magnifying lens of 4 times magnification.

G: The occurrence of minute black spots at a circuit end portion was observed by observation using a magnifying lens of 4 times magnification.

F: The presence of a black discolored portion recognizable by visual observation was observed.

P: Black discoloration was observed across the entire circuit by visual observation.

Evaluation of "F Formability"

With each of the coated articles of the invention that have the three-dimensional shape and were ultimately irradiated with ultraviolet rays, whether or not any abnormalities, such as cracking or breakage, etc., occurred at a coated film portion at which the elongation percentage became 250% was checked visually. Judgments were made as follows and VG and G were deemed as passing levels.

VG: Absolutely no abnormalities were observed by observation using a magnifying lens of 4 times magnification.

G: Slight change in gloss was observed by observation using a magnifying lens of 4 times magnification.

F: Change in gloss, clouding, or fine tearing of the coating film was observed by visual observation.

P: Significant crazing, cracking, or tearing of the coating film was observed visually.

For reference, the quality of screen printability in the coating step was evaluated as follows and VG and G were deemed as passing levels.

VG: There were absolutely no problems in terms of leveling, edge chipping, etc., at the 100th sheet.

G: Slight leveling defect or edge chipping occurred at the 90th to 99th sheet.

F: Slight leveling defect or edge chipping occurred at the 80th to 89th sheet.

P: Leveling defect or edge chipping occurred before the 79th sheet.

The evaluation results indicated in Table 1 show that with the ultraviolet curing type coating resin composition according to the invention, an ultraviolet curing type coating resin composition having all of the respective beneficial features of excellent state in chemical resistance against human skin protection creams containing an aromatic compound mixture of alkyl esters of benzoic acid, as represented by Neutrogena Cream, even under high temperature, excellent state in gas barrier property against metal-corrosive gases as represented by sulfur-containing gases, and being in excellent in flexibility that accommodates three-dimensional shape forming processing, an article coated by the ultraviolet curing type coating resin composition, and an article having a three-dimensional shape and coated by the ultraviolet curing type coating resin composition can be obtained.

The invention claimed is:

1. An ultraviolet curing coating resin composition, comprising an ultraviolet curing coating resin composition containing an unsaturated-group-containing acrylic resin, with a weight average molecular weight of 5000 to 70000, a number of (meth)acrylate functional groups per molecule of 12 to 40 according to a GPC method of Gel Permeation Chromatography, a hydroxyl value of 2 to 200 mgKOH/g, and with a glass transition temperature of 20 to 90° C., a volatile organic solvent, and a photopolymerization initiator,
wherein the ultraviolet curing coating resin composition has a chemically stable character,
wherein the ultraviolet curing coating resin composition has a gas barrier property, and
wherein the ultraviolet curing coating resin composition has flexibility accommodating a three-dimensional shape forming processing.

2. The ultraviolet curing coating resin composition according to claim 1, wherein the volatile organic solvent is any one or combination of a solvent selected from the group consisting of glycol solvent, an ester solvent, a ketone solvent, a polyhydric alcohol solvent, and an aromatic hydrocarbon solvent.

3. The ultraviolet curing coating resin composition according to claim 1, wherein the ultraviolet curing coating resin composition further contains more than 0 parts and not more than 80 parts by weight of a photopolymerizable low-molecular-weight compound that undergoes crosslinking or a polymerization reaction by ultraviolet rays compared with 100 parts weight of the acrylic resin.

4. The ultraviolet curing coating resin composition according to claim 3, wherein the photopolymerizable low-molecular-weight compound is at least one of the following selected from the group consisting of acryloylmorpholine, vinyl caprolactam, ethyl carbitol (meth)acrylate, phenoxyethyl (meth)acrylate, isobornyl (meth)acrylate, and 2-hydroxyethyl vinyl ether.

5. The ultraviolet curing coating resin composition according to claim 1, wherein the ultraviolet curing coating resin composition contains more than 0 parts and not more than 10 parts by weight of an acrylic high-molecular-weight polymer additive and/or a silicon additive compared with 100 parts by weight of the acrylic resin.

6. A coated article having a hardened coating layer of the ultraviolet curing coating resin composition according to claim 1.

7. A coated article with a three-dimensional shape, having a hardened coating layer of an ultraviolet curing coating resin composition according to claim 1.

8. A manufacturing method of the coated article according to claim 6, wherein the manufacturing method is performed with an order of a coating step, a heating and drying step, and an ultraviolet irradiation step.

9. A manufacturing method of the coated article with a three-dimensional shape according to claim 7, wherein the manufacturing method is performed with an order of a coating step, a heating and drying step, a three-dimensional shape forming step, and an ultraviolet irradiation step.

10. An ultraviolet curing coating resin composition, comprising an ultraviolet curing coating resin composition containing an unsaturated-group-containing acrylic resin with hydroxyl groups, with a weight average molecular weight of 5000 to 70000, a number of (meth)acrylate functional groups per molecule of 12 to 40, a hydroxyl value of 2 to 200 mgKOH/g, and with a glass transition temperature of 20 to 90° C., a volatile organic solvent, and a photopolymerization initiator,
wherein the ultraviolet curing coating resin composition further contains 2.5 to 10 parts by weight of a polyisocyanate with an NCOwt % of 6 to 24 compared with 100 parts by weight of the acrylic resin,
wherein the ultraviolet curing coating resin composition has a chemically stable character,
wherein the ultraviolet curing coating resin composition has a gas barrier property, and
wherein the ultraviolet curing coating resin composition has flexibility accommodating a three-dimensional shape forming processing.

11. The ultraviolet curing coating resin composition according to claim 10, wherein the polyisocyanate is any one or combination of hexamethylene diisocyanate and isophorone diisocyanate.

12. An ultraviolet curing coating resin composition, comprising an ultraviolet curing coating resin composition containing an unsaturated-group-containing acrylic resin with hydroxyl groups, with a weight average molecular weight of 5000 to 70000, a number of (meth)acrylate functional groups per molecule of 12 to 40, a hydroxyl value of 2 to 200 mgKOH/g, and with a glass transition temperature of 20 to 90° C., a volatile organic solvent, and a photopolymerization initiator,
wherein the ultraviolet curing coating resin composition further contains a polyisocyanate,
wherein the ultraviolet curing coating resin composition has a chemically stable character,
wherein the ultraviolet curing coating resin composition has a gas barrier property, and
wherein the ultraviolet curing coating resin composition has flexibility accommodating a three-dimensional shape forming processing.

* * * * *